(12) United States Patent
Hwang et al.

(10) Patent No.: US 7,245,015 B2
(45) Date of Patent: Jul. 17, 2007

(54) DISPLAY APPARATUS

(75) Inventors: Seong-Yong Hwang, Yongin-si (KR); Weon-Sik Oh, Osan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/202,464

(22) Filed: Aug. 11, 2005

(65) Prior Publication Data

US 2006/0163724 A1    Jul. 27, 2006

(30) Foreign Application Priority Data

Jan. 25, 2005    (KR) .................... 10-2005-0006572

(51) Int. Cl.
*H01L 23/52* (2006.01)

(52) U.S. Cl. .............................. 257/756; 257/E23.027; 257/781; 438/647

(58) Field of Classification Search ................ 257/756
See application file for complete search history.

(56) References Cited

U.S. PATENT DOCUMENTS

| | | | |
|---|---|---|---|
| 6,710,436 B1 * | 3/2004 | Harris et al. ................. | 257/686 |
| 2004/0169291 A1 * | 9/2004 | Yang et al. .................. | 257/786 |
| 2004/0245525 A1 * | 12/2004 | Yamazaki et al. ............. | 257/66 |
| 2005/0277231 A1 * | 12/2005 | Hembree et al. ........... | 438/127 |
| 2006/0022340 A1 * | 2/2006 | Ho et al. ..................... | 257/750 |
| 2006/0033875 A1 * | 2/2006 | Lin et al. .................... | 349/152 |

* cited by examiner

*Primary Examiner*—Leonardo Andujar
*Assistant Examiner*—Krista Soderholm
(74) *Attorney, Agent, or Firm*—Edward C. Kwok; MacPherson Kwok Chen & Heid LLP (57) ABSTRACT

In a display apparatus, a display panel receives a driving signal from a driving chip through a pad and displays an image in response to the driving signal. The driving chip includes a terminal outputting the driving signal. The driving chip is mounted on the display panel using the anisotropic conductive film and electrically connected to the display panel. A lubricant layer is formed on a surface of the anisotropic conductive film to prevent an electrical defect in the connection between the driving chip and the display panel. Thus, the display apparatus may have improved yield.

16 Claims, 10 Drawing Sheets

DISPLAY APPARATUS

CROSS-REFERENCE TO RELATED APPLICATION

This application claims priority of Korean Patent Application No. 2005-6572 filed on Jan. 25, 2005, the contents of which are herein incorporated by reference in its entirety.

BACKGROUND OF THE INVENTION

1. Field of the Invention

The present invention relates to a display apparatus. More particularly, the present invention relates to a display apparatus having an improved manufacturing yield.

2. Description of the Related Art

In general, a liquid crystal display apparatus includes a display unit that displays an image and a backlight assembly that applies light to the display unit.

The display unit includes a liquid crystal display panel that displays the image in response to a data signal and a gate signal, a data driving integrated circuit ("chip") that outputs the data signal and a gate driving chip that outputs the gate signal.

The display unit includes a tape carrier package (TCP), referred to hereafter as the data TCP, on which the data driving chip is mounted by a chip-on-film (COF) method and a TCP on which the gate driving chip, referred to hereafter as the gate TCP, is mounted by the COF method. The data TCP and the gate TCP are attached to the liquid crystal display panel by an outer lead bonding (OLB) method.

Alternatively, the data and gate driving chips are directly mounted on the liquid crystal display panel by a chip-on-glass (COG) method. The data driving chip connected to a data line is mounted on one side ("data side") of the liquid crystal display panel and a gate driving chip connected to a gate line is mounted on another side ("gate side") of the liquid crystal display panel by the COG method.

In the OLB and COG methods, the data and gate TCPs and the liquid crystal display panel are electrically connected to each other using an anisotropic conductive film, and the gate and data driving chips and the liquid crystal display panel are also electrically connected to each other using the anisotropic conductive film. An electrical defect in the connection between the data and gate TCPs and the liquid crystal display panel or between the gate and data driving chips and the liquid crystal display panel may occur due to a repelling force of an adhesive resin in the anisotropic conductive film. Since the repelling force of the adhesive resin increases with the distance the adhesive resin is spaced apart from a center portion of the driving chips and the TCPs, the electrical defect occurs especially often in large-scaled electric instruments, such as a liquid crystal display apparatus.

SUMMARY OF THE INVENTION

The present invention provides a display apparatus having an improved manufacturing yield.

In one aspect of the present invention, a display apparatus includes a display panel, a driving chip, an anisotropic conductive film and a lubricant layer.

The display panel receives a driving signal through a pad and displays an image in response to the driving signal. The driving chip has a terminal to output the driving signal and the anisotropic conductive film is disposed between the display panel and the driving chip. The lubricant layer is formed on a surface of the anisotropic conductive film.

In another aspect of the present invention, a display apparatus includes a display panel, a flexible film, an anisotropic conductive film and a lubricant layer. The display panel receives a driving signal through a pad and displays an image in response to the driving signal. The flexible film has a wire to apply the driving signal to the display panel. The anisotropic conductive film is disposed between the display panel and the flexible film, and the lubricant layer is formed on the anisotropic conductive film.

According to the above, the lubricant layer formed on the anisotropic conductive film may prevent an electrical defect in the connection between the driving chip and the display panel while the driving chip is attached to the display panel, thereby improving the yield of the display apparatus.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE EMBODIMENTS

Hereinafter, the present invention will be explained in detail with reference to the accompanying drawings.

Figure 1:
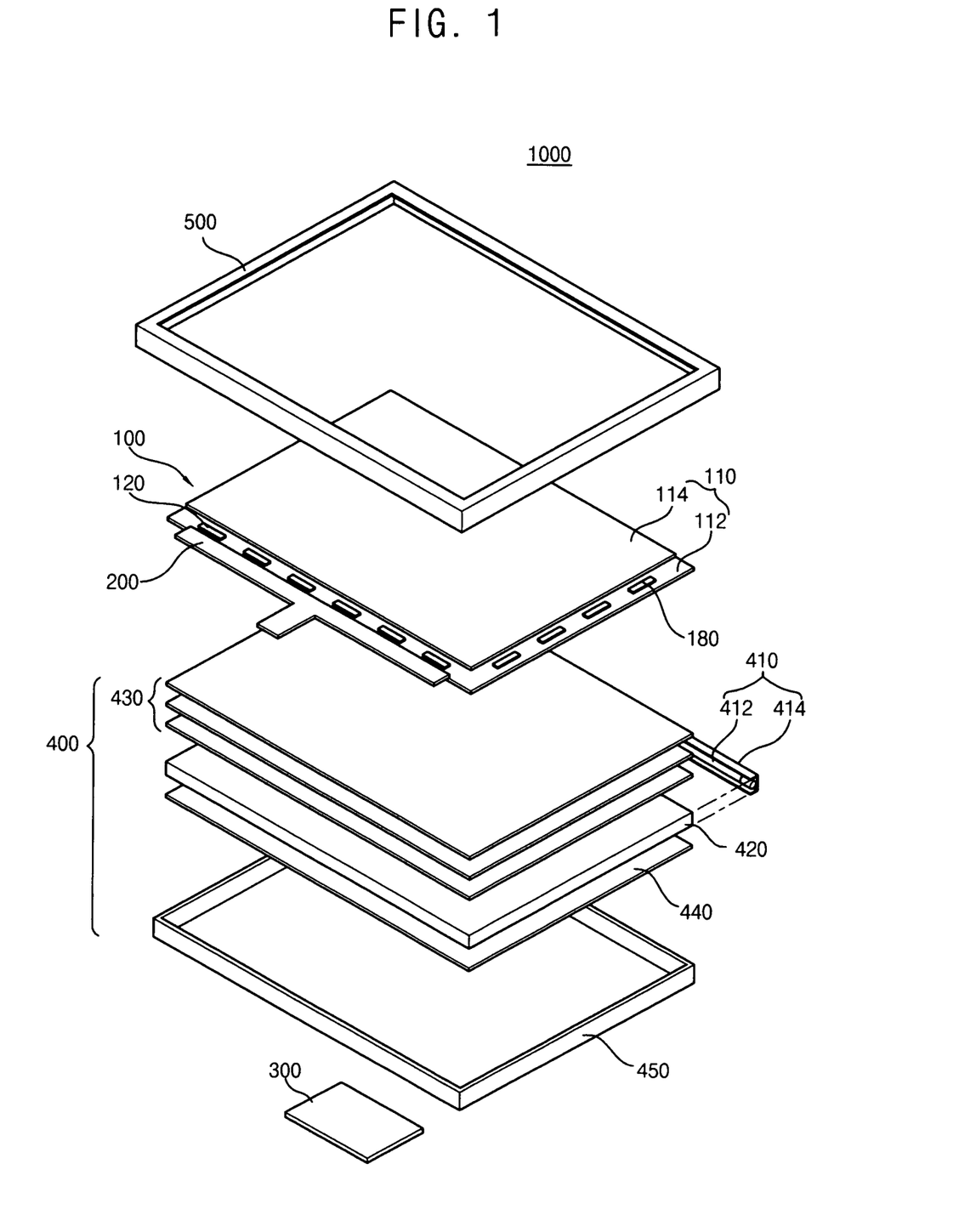
FIG. 1 is an exploded perspective view showing a liquid crystal display apparatus according to an exemplary embodiment of the present invention.
Figure 2:
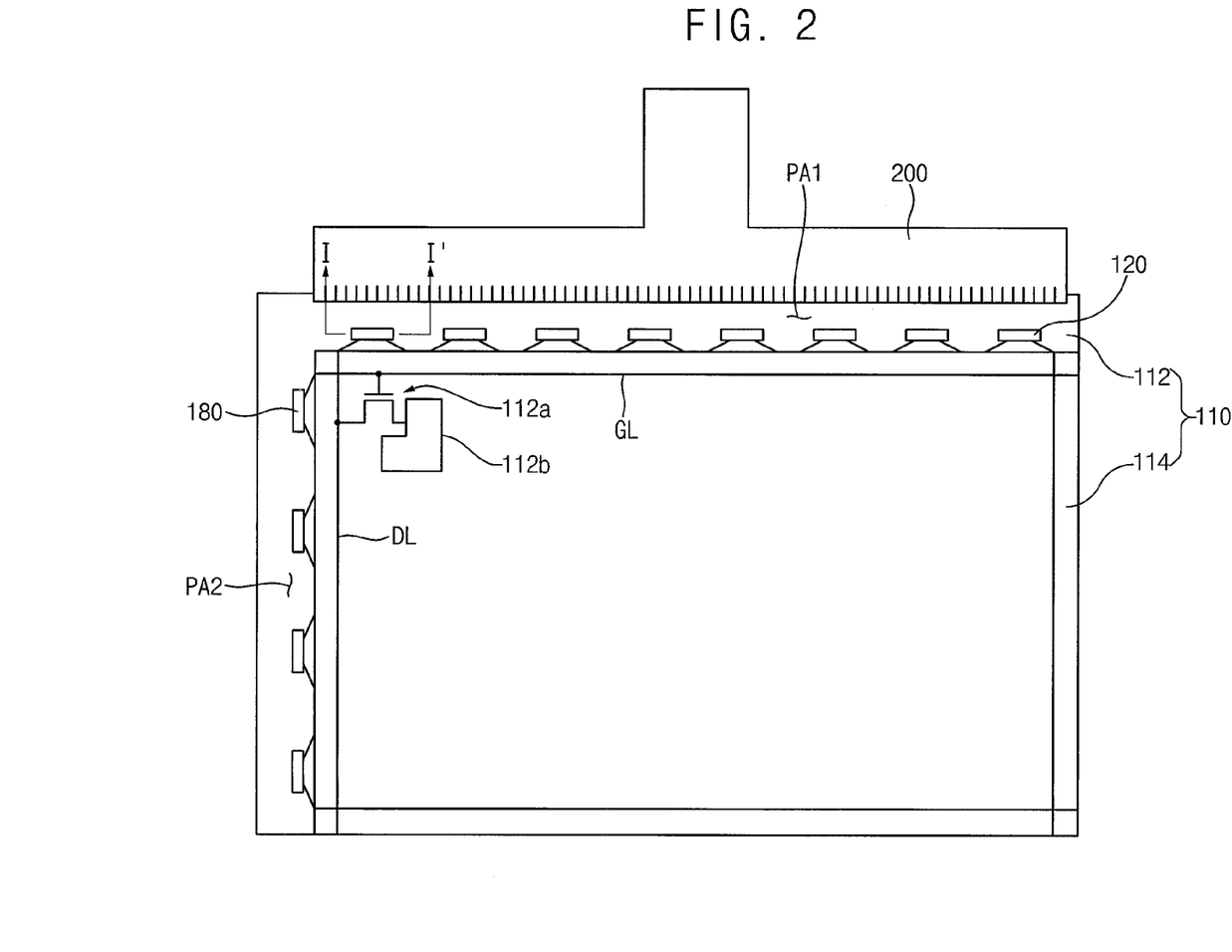
FIG. 2 is a plan view showing a display unit in the FIG. 1.

FIG. 1 is an exploded perspective view showing a liquid crystal display apparatus according to an exemplary embodiment of the present invention. FIG. 2 is a plan view showing a display unit in the FIG. 1.

Referring to FIG. 1, a liquid crystal display apparatus 1000 includes a display unit 100, a backlight assembly 400 and a top chassis 500. The backlight assembly 400 is disposed under the display unit 100 and generates light, and the display unit 100 displays an image using the light. The top chassis 500 fixes the display unit 100 to the backlight assembly 400.

The display unit 100 includes a liquid crystal display panel 110, a driving circuit board 300, a flexible printed circuit board 200, a data driving chip 120 and a gate driving chip 180. The driving circuit board 300 outputs a driving signal, and the flexible printed circuit board 200 electrically connects the driving circuit board 300 and the liquid crystal display panel 110. That is, the flexible printed circuit board 200 applies the driving signal from the driving circuit board 300 to the liquid crystal display panel 110.

The liquid crystal display panel 110 includes a thin film transistor (TFT) substrate 112, a color filter substrate 114 and a liquid crystal layer (not shown). The color filter substrate 114 is coupled to the TFT substrate 112, and the liquid crystal layer is disposed between the TFT substrate 112 and the color filter substrate 114.

As shown in FIG. 2, the TFT substrate 112 includes a plurality of data lines DL, a plurality of gate lines GL, a plurality of TFTs 112a and a plurality of pixel electrodes 112b. The data lines DL intersect with and are insulated from the gate lines GL. A plurality of pixel areas is defined on the TFT substrate by the data lines DL and the gate lines GL. The TFTs 112a are formed in the pixel areas, respectively. Each of the TFTs 112a includes a source terminal connected to a corresponding data line, a gate terminal connected to a corresponding gate line, and a drain terminal connected to a corresponding pixel electrode. In the present embodiment, the pixel electrodes 112b include a transparent conductive material.

The color filter substrate 114 is a substrate on which RGB color pixels (not shown) are formed by a thin film process. The color filter substrate 114 includes a common electrode (not shown) formed thereon. The common electrode includes the transparent conductive material.

The data driving chip 120 and the gate driving chip 180 are directly mounted on the TFT substrate 112 by a COG process. The data driving chip 120 is mounted on the first peripheral area PA1 adjacent to an end of the data lines DL, and the gate driving chip 180 is mounted on the second peripheral area PA2 adjacent to an end of the gate lines GL. In the present embodiment, the data driving chip 120 is electrically connected to the data lines DL and applies the data signal from the flexible printed circuit board 200 to the data lines DL. The gate driving chip 180 is electrically connected to the gate lines GL and sequentially applies the gate signal from the flexible printed circuit board 200 to the gate lines GL.

In the present embodiment, the display unit 100 includes a plurality of data driving chips such as the data driving chip 120 and a plurality of gate driving chips such as the gate driving chip 180.

Referring to FIG. 1, the backlight assembly 400 includes a lamp unit 410, a light guide plate 420 and a receiving container 450. The lamp unit 410 includes a lamp 412 that generates the light and a lamp cover 414. The light guide plate 420 changes a path of the light from the lamp unit 410 and emits the light to the liquid crystal display panel 110. The receiving container 450 receives the lamp unit 410 and the light guide plate 420.

The backlight assembly 400 further includes a plurality of optical sheets 430 and a reflecting plate 440. The optical sheets 430 improve front brightness and visual characteristics of the light advancing to the liquid crystal display panel 110 from the light guide plate 420. In the present embodiment, the optical sheets 430 include a diffusing sheet that diffuses the light and a prism sheet that condenses the light. The reflecting plate 440 reflects the light leaking from the light guide plate 420 back to the light guide plate 420, thereby improving light efficiency.

In the present embodiment, in order to provide the liquid crystal display panel 110 with the light, the display apparatus 1000 may have an edge-type backlight assembly of which the lamp 412 is placed adjacent to a side face of the light guide plate 420, or the display apparatus 1000 may be a direct illumination type of which a plurality of lamps such as the lamp 412 disposed under the liquid crystal display panel 110.

Figure 3A:
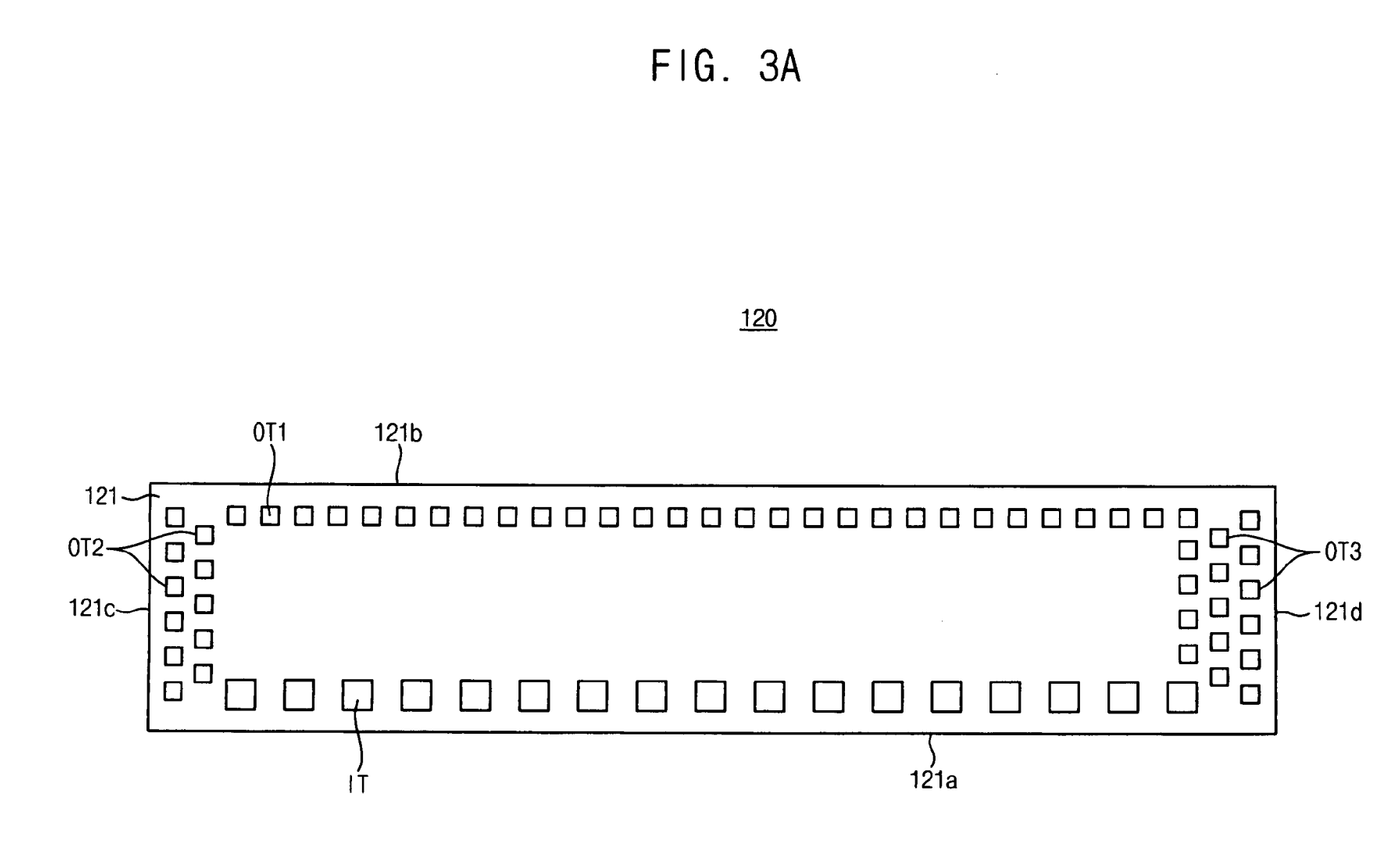
FIG. 3A is a plan view showing a data driving chip in FIG. 2.
Figure 3B:
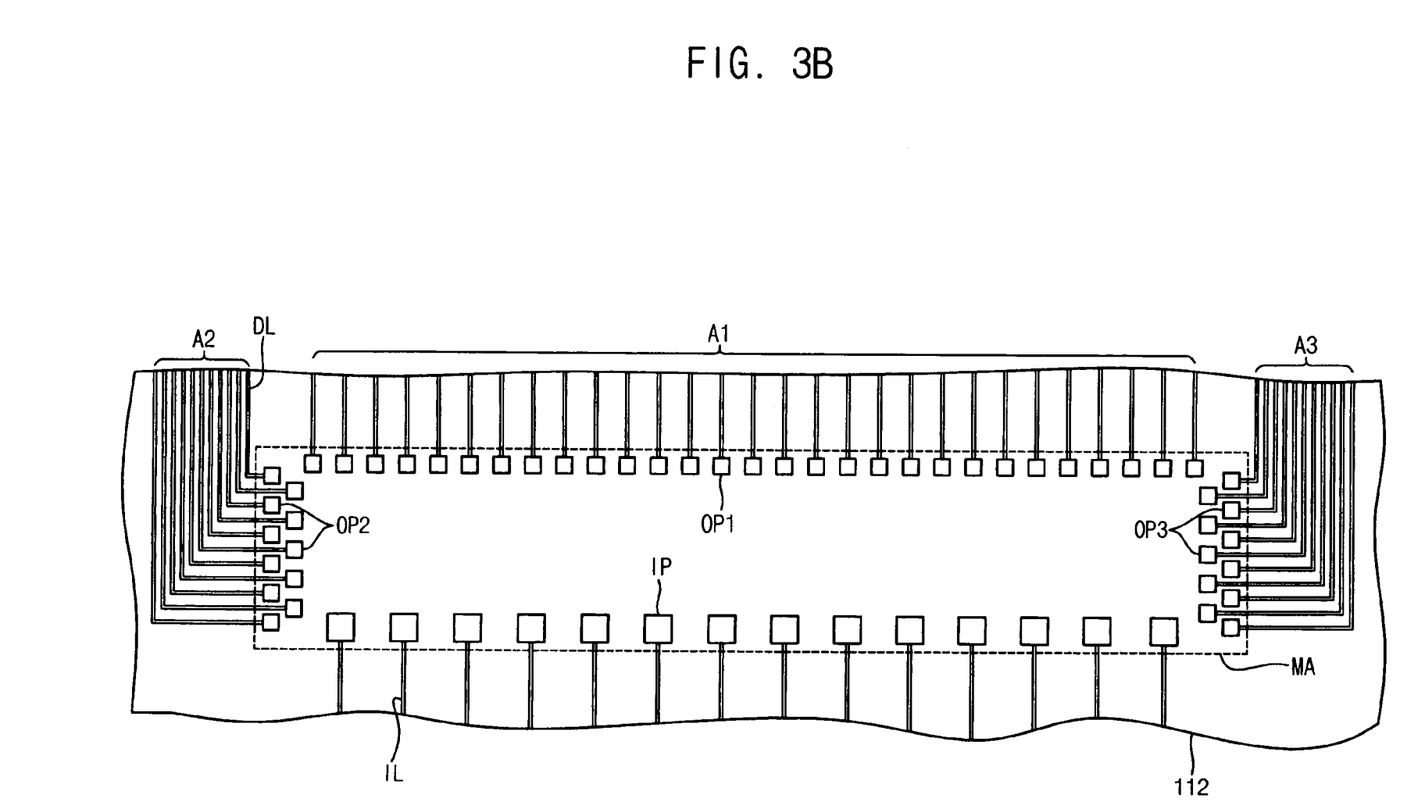
FIG. 3B is a plan view showing an area on which the data driving chip is mounted of a TFT substrate.

FIG. 3A is a plan view showing a data driving chip in FIG. 2. FIG. 3B is a plan view showing an area on which the data driving chip is mounted of a TFT substrate.

Referring to FIG. 3A, the data driving chip 120 includes a body 121, a plurality of input terminals IT, a plurality of first output terminals OT1, a plurality of second output terminals OT2 and a plurality of third output terminals OT3.

The body 121 includes an insulating material and has a generally rectangular shape. That is, the body 121 includes a first long side 121a, a second long side 121b, a first short side 121c and a second short side 121d. The first and second long sides 121a and 121b are substantially in parallel with the first and second short sides 121c and 121d.

The input terminals IT are protruded from the body 121 by a predetermined height, formed at a first end of the body 121 adjacent to the first long side 121a, and arranged along the first long side 121a. The first output terminals OT1 are protruded from the body 121, formed at a second end of the body 121 adjacent to the second long side 121b, and arranged along the second long side 121b.

The second output terminals OT2 are protruded from the body 121, formed at a third end of the body 121 adjacent to the first short side 121c, and arranged along the first short side 121c. The third output terminals OT3 are protruded from the body 121, formed at a fourth end of the body 121 adjacent to the second short side 121d, and arranged along the second short side 121d. In the present embodiment, the second and third output terminals OT2 and OT3 are arranged in two rows along the third and fourth ends, respectively.

The first, second and third output terminals OT1, OT2 and OT3 may have a same size and shape. However, since numbers of the first, second and third output terminals OT1, OT2 and OT3 are larger than the number of the input terminals IT, the first, second and third output terminals OT1, OT2 and OT3 each have a smaller size than the input terminals IT.

Referring to FIG. 3B, the TFT substrate 112 includes a plurality of input pads IP, a plurality of first output pads OP1, a plurality of second output pads OP2 and a plurality of third output pads OP3 in a mounting area MA on which the data driving chip 120 is mounted. Further, the TFT substrate 112 includes a plurality of input lines IL and the data lines DL adjacent to the mounting area MA.

The input pads IP are arranged in a signal line on the TFT substrate 112 and electrically connected to the input lines IL. Although not shown in the figures, the input lines IL receive the driving signal from the flexible printed circuit board 200. The input pads IP are electrically connected to the input terminals IT in FIG. 3A and in a one-to-one correspondence relation. The driving signal is applied to the data driving chip 120 through the input lines IL, the input pad IP and the input terminals IT.

The first output pads OP1 are arranged in a single-line on the TFT substrate 112 and spaced apart from the input pads IP by a predetermined distance. The first output pads OP1 are electrically connected to a first group A1 of the data lines DL. The first output pads OP1 are electrically connected to and in a one-to-one correspondence relation with the first output terminals OT1 in FIG. 3A.

The second output pads OP2 are arranged on the TFT substrate 112 in a substantially vertical direction to the first output pads OP1 and electrically connected to a second group A2 of the data lines DL. The second output pads OP2 are in a one-to-one correspondence relation with the second output terminals OT2 in FIG. 3A. The third output pads OP3 are spaced apart from the second output pads OP2 and arranged in a substantially vertical direction to the first output pads OP1. The third output pads OP3 are electrically connected to a third group A3 of the data lines DL. The third output pads OP3 are in a one-to-one correspondence relation with the third output terminals OT3 in FIG. 3A. In the present embodiment, each of the first and second output pads OP2 and OP3 is arranged in a double-line.

The data driving chip 120 outputs the data signal through the first, second and third output terminals OT1, OT2 and OT3. The data signals outputted from the data driving chip 120 are applied to the first, second and third groups A1, A2 and A3 of the data lines DL through the first, second and third output pads OP1, OP2 and OP3, respectively.

The gate driving chip 180 and the area on which the gate driving chip 180 is mounted shown in FIG. 2 have a same structure as the data driving chip 120 and the area on which the data driving chip 120 is mounted shown in FIGS. 3A and 3B.

Figure 4A:
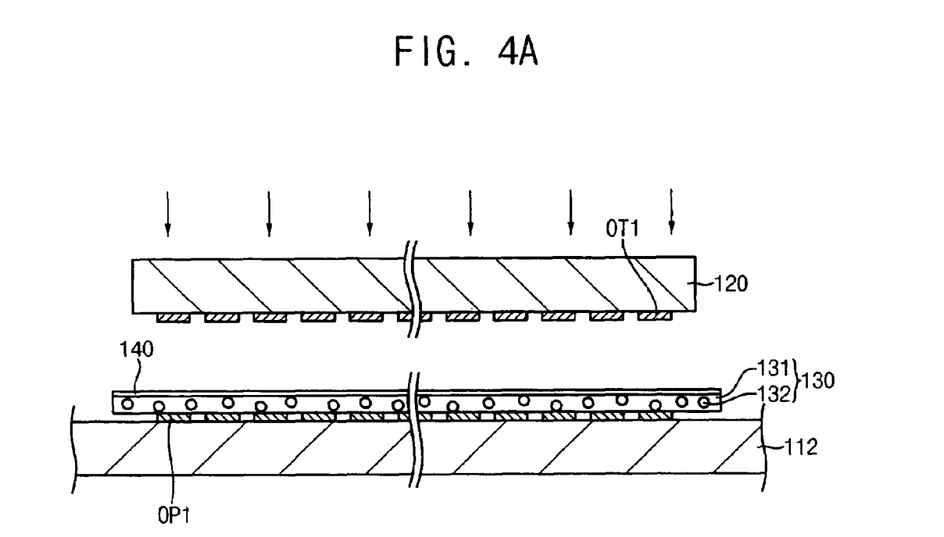
FIG. 4A is a cross-sectional view showing a data driving chip and a display panel.
Figure 4B:
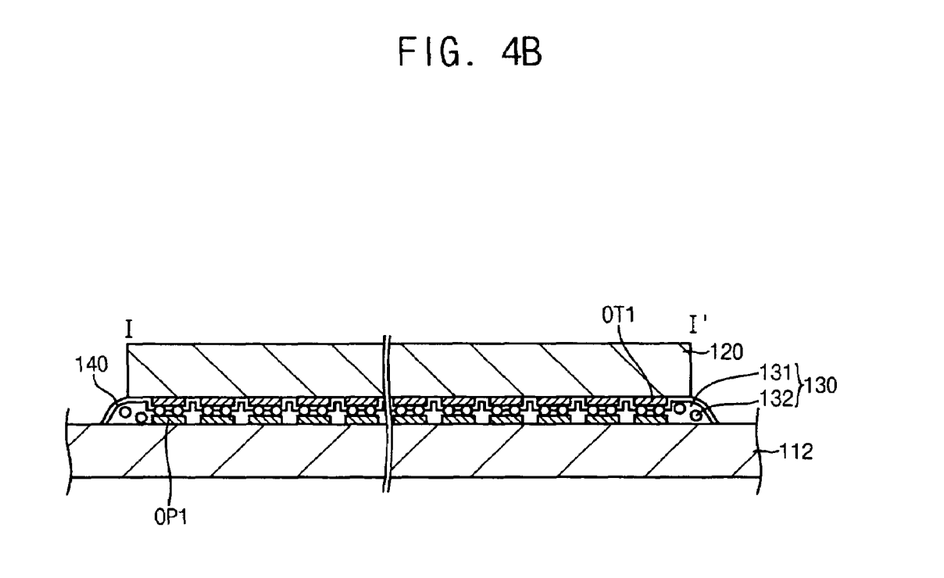
FIG. 4B is a cross-sectional view taken along a line I-I' in FIG. 2.

FIG. 4A is a cross-sectional view showing a data driving chip and a display panel. FIG. 4B is a cross-sectional view taken along a line I-I' in FIG. 2.

Referring to FIG. 4A, the data driving chip 120 is mounted on the mounting area MA of the TFT substrate 112 by the COG process. That is, when the anisotropic conductive film 130 is formed between the data driving chip 120 and the TFT substrate 112, the data driving chip 120 is coupled to the TFT substrate 112 due to an external temperature and an external pressure.

The anisotropic conductive film 130 includes an adhesive resin 131 and a plurality of conductive particles 132 irregularly distributed in the adhesive resin 131. The adhesive resin 131 includes a thermosetting resin, and the conductive particles 132 have a generally spherical shape.

The anisotropic conductive film 130 further includes a lubricant layer including oil or a silicone compound.

As shown in FIG. 4B, a distance between the data driving chip 120 and the TFT substrate 112 is reduced due to the pressure externally provided. Thus, the conductive particles 132 between the data driving chip 120 and the TFT substrate 112 electrically connect the first output terminals OT1 of the data driving chip 120 and the first output pads OP1 of the TFT substrate 112.

Also, the adhesive resin 131 is cured due to the temperature externally provided to fix the data driving chip 120 to the TFT substrate 112.

The lubricant layer 140 reduces a repelling force of the adhesive resin 131 with respect to the data driving chip 120 while the data driving chip 120 is coupled to the TFT substrate 112. When the repelling force of the adhesive resin 131 is reduced for the COG process, the conductive particles 132 may be easily deformed due to the external pressure. As a result, the first output terminals OT1 of the data driving chip 120 and the first output pads OP1 of the TFT substrate 112 may be electrically connected to each other by the deformed conductive particles 132. Thus, the electrical defect in the connection between the data driving chip 120 and the TFT substrate 112 may be prevented.

Figure 5A:
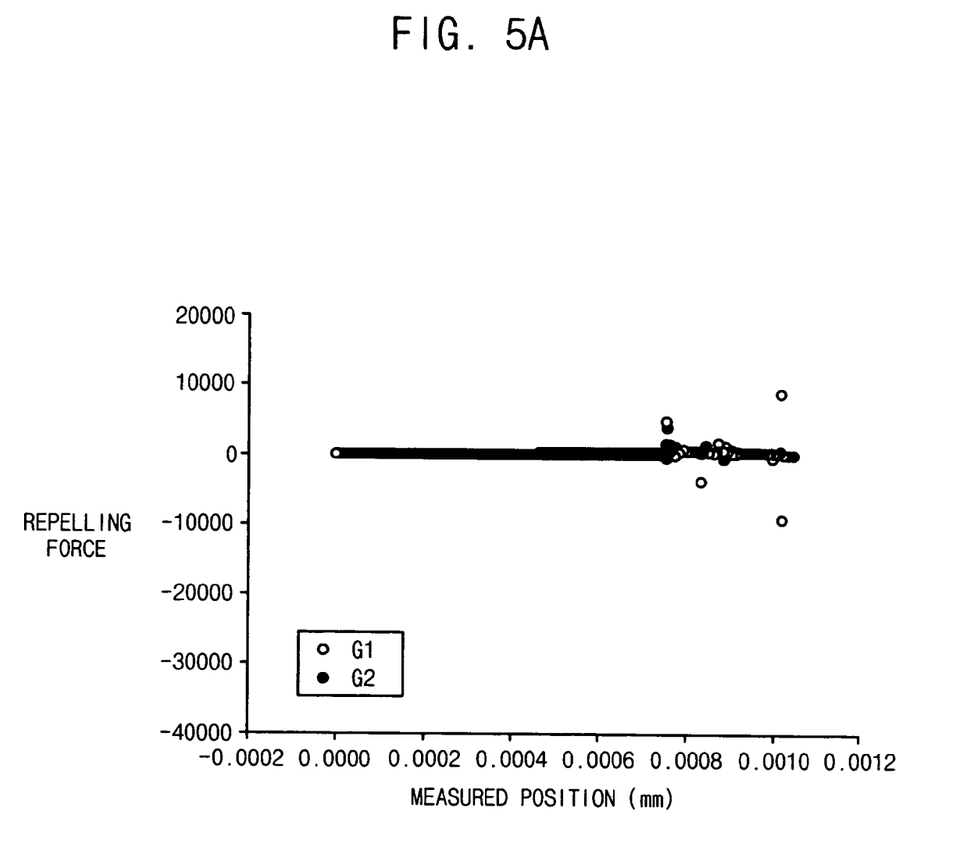
FIG. 5A is a graph showing a repelling force of an anisotropic conductive film according to measured positions.
Figure 5B:
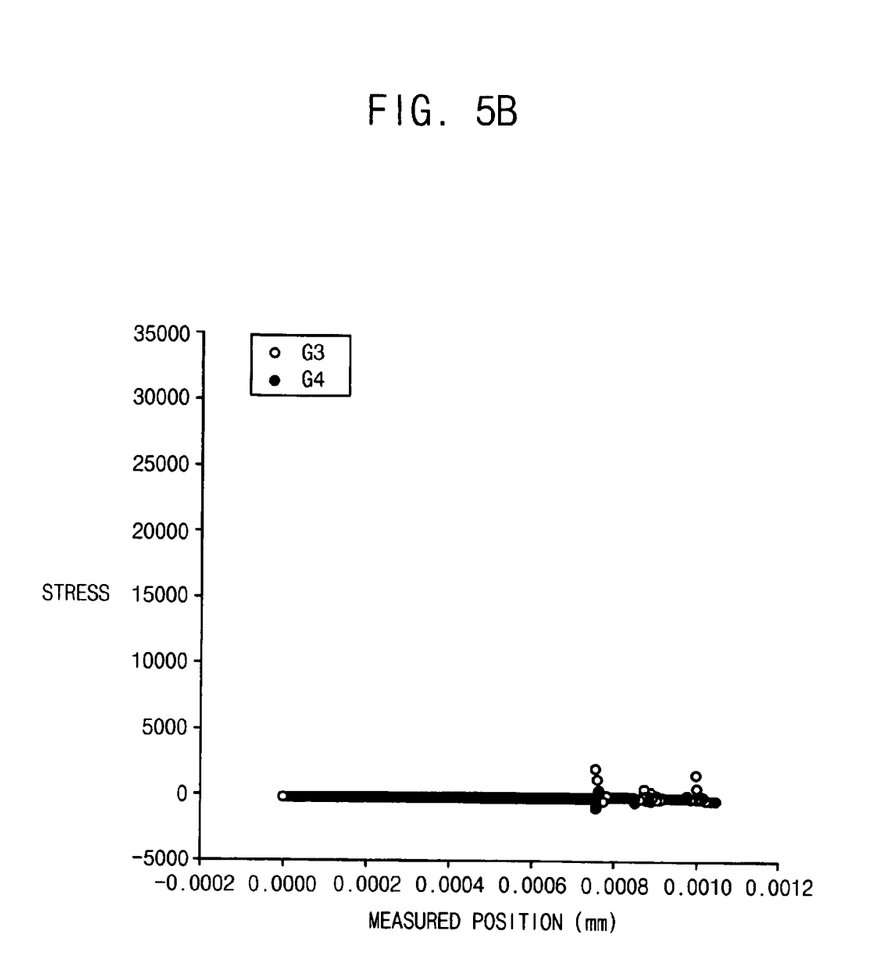
FIG. 5B is a graph showing stress applied to the anisotropic conductive film according to measured positions.

FIG. 5A is a graph showing a repelling force of an anisotropic conductive film according to measured positions. FIG. 5B is a graph showing stress applied to the anisotropic conductive film according to measured positions. In FIGS. 5A and 5B, the measured positions indicate a spaced distance between a center portion of the data driving chip and the measured positions.

Referring to FIGS. 5A and 5B, a first graph G1 represents the repelling force of the adhesive resin in a conventional liquid crystal display apparatus not having the lubricant layer 140 (refer to FIG. 4B) according to the measured positions, and the second graph G2 represents the repelling force of the adhesive resin 131 (refer to FIG. 4B) in the liquid crystal display apparatus of the present invention. The graph G3 represents the stress applied to the adhesive resin in the conventional liquid crystal display apparatus not having the lubricant layer 140, and the fourth graph G4 represents the stress applied to the adhesive resin 131 in the liquid crystal display apparatus of the present invention.

In accordance with the first and third graphs G1 and G3, the repelling force and the stress increase as further the measured positions are spaced apart from the center portion (0.0000 mm) of the data driving chip 120. Particularly, the repelling force and the stress are maintained in substantially '0' between the center portion (0.0000 mm) and the measured position (0.0007 mm), and remarkably increase between the measured positions from about 0.0007 mm to about 0.0011 mm.

In general, when the external pressure is applied to the data driving chip 120 while the data driving chip 120 is coupled to the TFT substrate 112, a flowing speed of the adhesive resin 131 increases as further the adhesive resin 131 is spaced apart from the center portion of the data driving chip 120. According to the increase of the flowing speed of the adhesive resin 131, both the repelling force of the adhesive resin 131 and the stress applied to the adhesive resin 131 increase. The data driving chip 120 may be spaced apart from the TFT substrate 112, so that the electrical defect in connection between the data driving chip 120 and the TFT substrate 112 due to the repelling force of the adhesive resin 131 is generated.

In accordance with the second and fourth graphs G2 and G4, the repelling force of the adhesive resin 131 and the stress applied to the adhesive resin are maintained in substantially '0' between the center portion (0.0000 mm) and the measured position (0.0012 mm).

In the present embodiment, the lubricant layer 140 between the data driving chip 120 and the anisotropic conductive film 130 reduces friction between the adhesive resin 131 and the data driving chip 120 due to the external pressure. As a result, although the adhesive resin 131 is spaced apart from the center portion (0.0000 mm) of the data driving chip 120, the flowing speed may not be increased. Thus, the repelling force of the adhesive resin 131 may be reduced and the external pressure may be normally applied to the conductive particles 132 in the adhesive resin 131. Also, the output terminals of the data driving chip 120 may be electrically connected to the output pads of the TFT substrate 112, thereby preventing the electrical defect in the connection between the data driving chip 120 and the TFT substrate 112.

Figure 6:
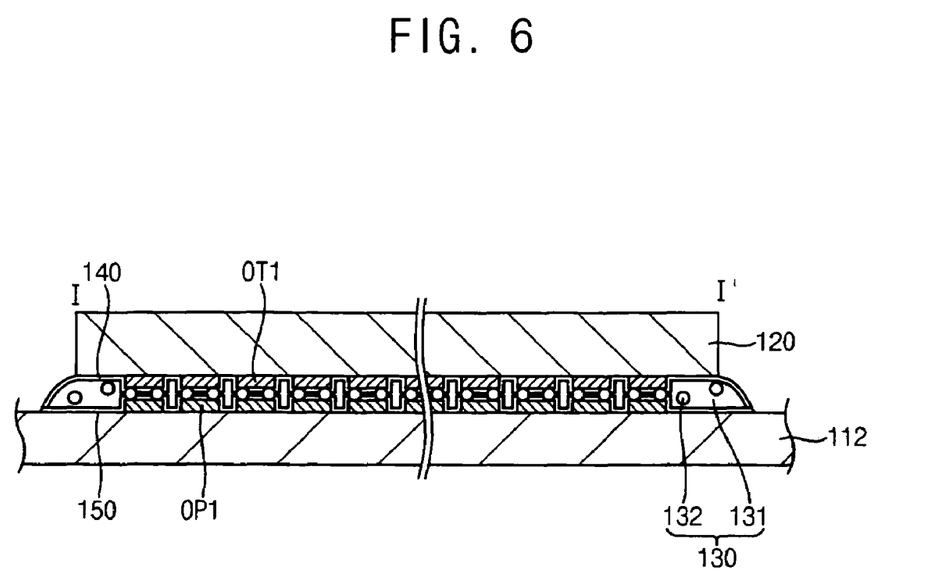
FIG. 6 is a cross-sectional view showing a data driving chip coupled to a liquid crystal display panel according to another exemplary embodiment of the present invention.

FIG. 6 is a cross-sectional view showing a data driving chip coupled to a liquid crystal display panel according to another exemplary embodiment of the present invention.

Referring to FIG. 6, a first lubricant layer 140 is formed on a first face of the anisotropic conductive film 130 facing the data driving chip 120, and a second lubricant layer 150 is formed on a second face of the anisotropic conductive film 130 facing the TFT substrate 112.

The first lubricant layer 140 reduces the friction between the data driving chip 120 and the anisotropic conductive film 130 for the COG process, and the second lubricant layer 140 reduces the friction between the TFT substrate 112 and the anisotropic conductive film 130.

Thus, the repelling force of the adhesive resin 131 with respect to the data driving chip 120 and the TFT substrate 112 may be reduced. As a result, the conductive particles 132 may electrically connect the first output terminals OT1 of the data driving chip 120 and the first output pads OP1 of the TFT substrate 112, to thereby prevent the electrical defect in the connection between the data driving chip 120 and the TFT substrate 112.

Figure 7:
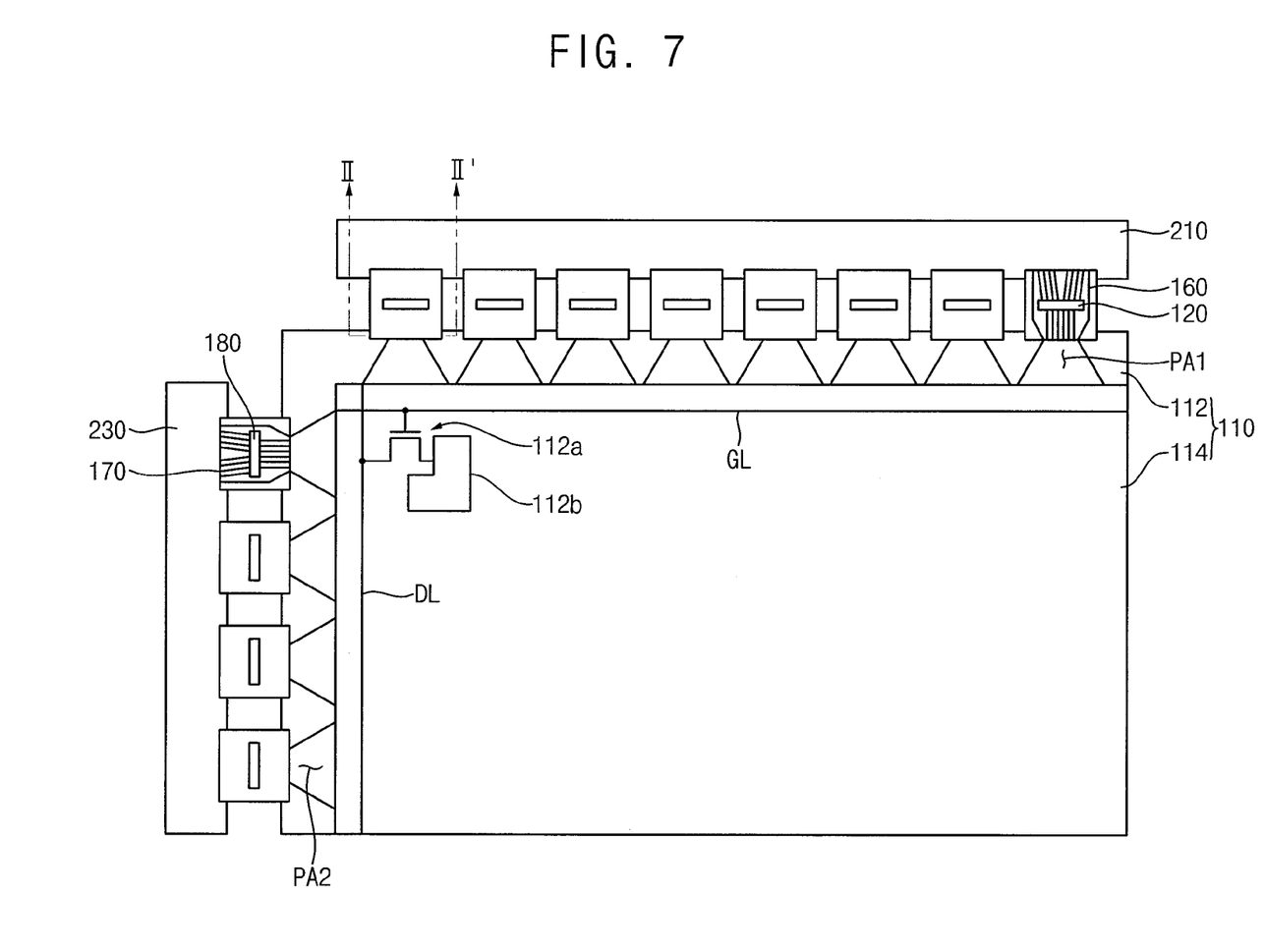
FIG. 7 is a plan view showing a display unit according to another exemplary embodiment of the present invention.

FIG. 7 is a plan view showing a display unit according to another exemplary embodiment of the present invention. In FIG. 7, the same reference numerals denote the same elements in FIG. 2, and thus any further repetitive descriptions of the same elements will be omitted.

Referring to FIG. 7, a display unit 100 includes a liquid crystal display panel 110, a data TCP 160, a gate TCP 170, a data driving chip 120, a gate driving chip 180, a data printed circuit board (PCB) 210 and a gate PCB 230.

The liquid crystal display panel 110 includes a TFT substrate 112, a color filter substrate 114 and a liquid crystal layer (not shown). The TFT substrate 112 includes a plurality of data lines DL, a plurality of gate lines GL, a plurality of TFTs 112a and a plurality of pixel electrodes 112b. The TFT substrate 112 includes a first peripheral area PA1 adjacent to a first end of the data lines DL and a second peripheral area PA2 adjacent to a first end of the gate lines GL.

The data TCP 210 includes a first end attached to the first peripheral area PA1 of the TFT substrate 112 and a second end attached to the data PCB 210. The gate TCP 170 includes a first end attached to the second peripheral area PA2 of the TFT substrate 112 and a second end attached to the gate PCB 230. Thus, the data PCB 210 and the TFT substrate 112 are electrically connected to each other by the data TCP 160, and the gate PCB 230 and the TFT substrate 112 are electrically connected to each other by the gate TCP 170.

The data and gate driving chips 120 and 180 are mounted on the data and gate TCPs 160 and 170, respectively. The data driving chip 120 outputs the data signal of the driving signals from the data PCB 210, and the gate driving chip 180 outputs the gate signal of the driving signals from the gate PCB 230.

The data TCP 160 and the gate TCP 170 are attached to the TFT substrate 112 by the OLB process.

Figure 8A:
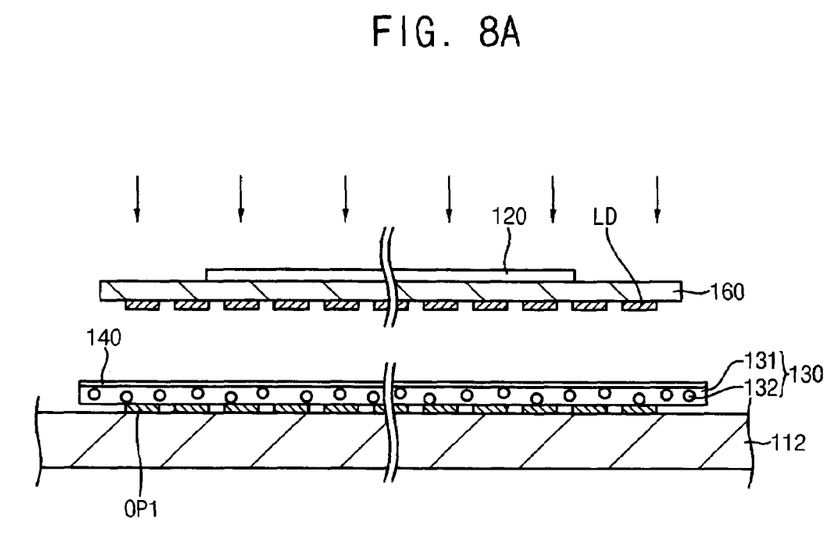
FIG. 8A is a cross-sectional view showing a data driving chip and a display panel.
Figure 8B:
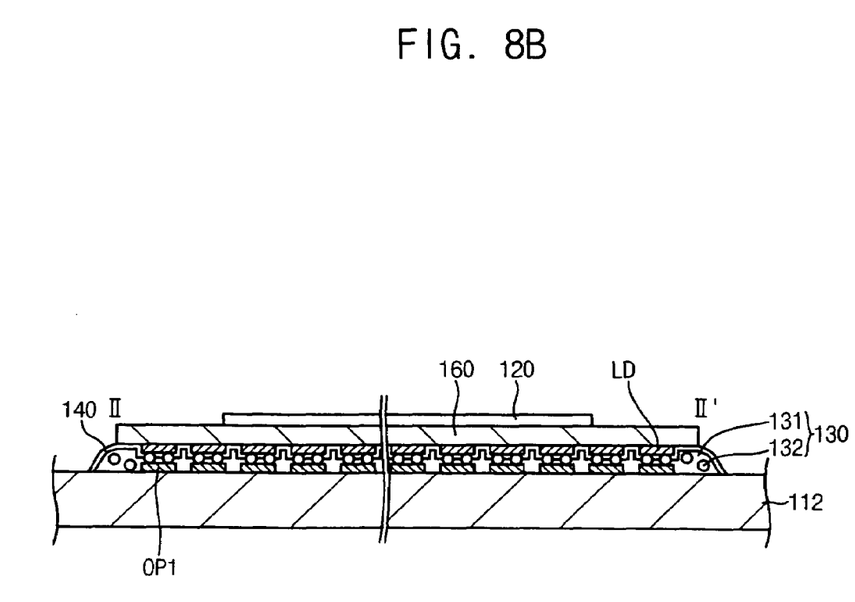
FIG. 8B is a cross-sectional view taken along a line II-II' in FIG. 7.

FIG. 8A is a cross-sectional view showing a data driving chip and a display panel. FIG. 8B is a cross-sectional view taken along a line II-II' in FIG. 7.

Referring to FIG. 8A, when the anisotropic conductive film 130 is formed between the data TCP 160 and the TFT substrate 112, the data TCP 160 is coupled to the TFT substrate 112 due to an external temperature and an external pressure.

The anisotropic conductive film 130 includes an adhesive resin 131 and a plurality of conductive particles 132 irregularly distributed in the adhesive resin 131. The anisotropic conductive film 130 further includes a lubricant layer formed thereon, such as oil or silicone compound.

As shown in FIG. 8B, a distance between the data TCP 160 and the TFT substrate 112 is reduced due to the pressure externally provided. Thus, the conductive particles 132 between the data TCP 160 and the TFT substrate 112 electrically connect a plurality of output leads LD of the data TCP 160 and the first output pads OP1 of the TFT substrate 112. Also, the adhesive resin 131 is cured due to the temperature externally provided to fix the data TCP 160 to the TFT substrate 112.

The lubricant layer 140 reduces a repelling force of the adhesive resin 131 with respect to the data TCP 160 while the data TCP 160 is coupled to the TFT substrate 112 by the OLB process. When the repelling force of the adhesive resin 131 is reduced for the OLB process, the conductive particles 132 may be easily deformed due to the external pressure. As a result, the output leads LD of the data TCP 160 and the first output pads OP1 of the TFT substrate 112 may be electrically connected to each other by the deformed conductive particles 132. Thus, the electrical defect in the connection between the data TCP 160 and the TFT substrate 112 may be prevented.

Although not shown in the figures, the gate TCP 170 in FIG. 7 is attached to the TFT substrate 112 by the same processes as those of the data TCP 160, and also the anisotropic conductive film 130 and the lubricant layer 140 are formed between the gate TCP 170 and the TFT substrate 112. Thus, the electrical defect in the connection between the gate TCP 170 and the TFT substrate 112 may be prevented.

According to the display apparatus, the anisotropic conductive film electrically connecting the driving chip to the display panel includes the lubricant layer thereon. The lubricant layer reduces the repelling force of the adhesive resin in the anisotropic conductive film for the COG process or OLB process.

Thus, the electrical defects in the connection between the driving chip and the display panel or between the film and the display panel while the COG process or the OLB process is performed, thereby improving the yield of the display apparatus.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display apparatus comprising:
   a display panel to receive a driving signal through a pad and to display an image in response to the driving signal;
   a driving chip having a terminal to output the driving signal to the display panel;
   an anisotropic conductive film provided between the display panel and the driving chip, the anisotropic conductive film being cured under pressure to provide an electrical connection between the terminal and the pad; and
   a lubricant layer, comprising oil or a silicone compound, on the anisotropic conductive film.

2. The display apparatus of claim 1, wherein the lubricant layer is disposed between the driving chip and the anisotropic conductive film or between the display panel and the anisotropic conductive film.

3. The display apparatus of claim 1, wherein the lubricant layer is disposed between the display panel and the anisotropic conductive film and between the driving chip and the anisotropic conductive film.

4. The display apparatus of claim 1, wherein the anisotropic conductive film comprises:

an adhesive resin to fix the driving chip to the display panel; and a plurality of conductive particles to electrically connect the pad and the terminal, the conductive particles being irregularly distributed in the adhesive resin.

5. The display apparatus of claim 1, wherein the driving chip comprises:
a base body having a long side and a short side substantially perpendicular to the long side;
a plurality of first terminals on a face of the base body, the first terminals being formed at a first end of the face and arranged along the long side of the base body;
a plurality of second terminals formed at a second end of the face and arranged along the long side;
a plurality of third terminal formed at a third end adjacent to the first end and arranged along the short side; and
a plurality of fourth terminal formed at a fourth end and arranged along the short side.

6. The display apparatus of claim 5, wherein the third and fourth terminals are arranged in a double-line at the third and fourth ends, respectively.

7. The display apparatus of claim 1, wherein the pad comprises: a gate pad extended from a gate line of the display panel so as to receive a gate signal of the driving signal; and a data pad extended from a data line of the display panel so as to receive a data signal of the driving signal.

8. The display apparatus of claim 7, wherein the driving chip comprises: a gate driving chip to output the gate signal; and a data driving chip to output the data signal.

9. A display apparatus comprising:
a display panel to receive a driving signal through a pad and display an image in response to the driving signal;
a flexible film having a wire to apply the driving signal to the display panel;
an anisotropic conductive film provided between the display panel and the flexible film to provide an electrical connection between the pad and the wire; and
a lubricant layer, comprising oil or a silicone compound, on the anisotropic conductive film reducing a force in the anisotropic conductive film when the anisotropic conductive film is being formed between the display panel and the flexible film.

10. The display apparatus of claim 1, wherein the lubricant layer is disposed between the flexible film and the anisotropic conductive film or between the display panel and the anisotropic conductive film.

11. The display apparatus of claim 9, wherein the lubricant layer is disposed between the flexible film and the anisotropic conductive film and between the display panel and the anisotropic conductive film.

12. The display apparatus of claim 9, wherein the anisotropic conductive film comprises:
an adhesive resin to fix the flexible film to the display panel; and
a plurality of conductive particles to electrically connect the pad and the wire, the conductive particles being irregularly distributed in the adhesive resin.

13. The display apparatus of claim 9, wherein the flexible film is a tape carrier package.

14. The display apparatus of claim 9, wherein the pad comprises:
a gate pad extended from a gate line of the display panel so as to receive a gate signal of the driving signal; and
a data pad extended from a data line of the display panel so as to receive a data signal of the driving signal.

15. The display apparatus of claim 14, further comprising a driving chip to output the driving signal, the driving chip being mounted on the flexible film.

16. The display apparatus of claim 15, wherein the flexible film comprises:
a gate flexible film to apply the gate signal to the gate pad, the gate flexible film being mounted on a gate driving chip of the driving chip outputting the gate signal; and
a data flexible film to apply the data signal to the data pad, the data flexible film being mounted on a data driving chip of the driving chip outputting the data signal.

* * * * *